United States Patent
Diewald et al.

(10) Patent No.: US 11,342,146 B2
(45) Date of Patent: *May 24, 2022

(54) SYSTEM AND METHOD FOR ENERGY MONITORING

(71) Applicant: TEXAS INSTRUMENTS INCORPORATED, Dallas, TX (US)

(72) Inventors: Horst Diewald, Freising (DE); Johan Zipperer, Unterschleissheim (DE); Peter Weber, Allershausen (DE); Anton Brauchle, Mering (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 45 days.

This patent is subject to a terminal disclaimer.

(21) Appl. No.: 16/903,474

(22) Filed: Jun. 17, 2020

(65) Prior Publication Data
US 2020/0381202 A1 Dec. 3, 2020

Related U.S. Application Data

(63) Continuation of application No. 14/020,184, filed on Sep. 6, 2013, now Pat. No. 10,707,038.

(51) Int. Cl.
*H01H 47/00* (2006.01)
*H02M 3/157* (2006.01)
(Continued)

(52) U.S. Cl.
CPC .......... *H01H 47/00* (2013.01); *G06F 1/324* (2013.01); *G06F 1/3206* (2013.01);
(Continued)

(58) Field of Classification Search
CPC ...... H01H 47/00; H02M 3/157; G06F 1/3206; G06F 1/324; G06F 1/3296; Y02D 10/00; G01R 22/10
See application file for complete search history.

(56) References Cited

U.S. PATENT DOCUMENTS 4,097,773 A * 6/1978 Lindmark ............. H02M 7/537
327/538
5,640,573 A 6/1997 Gephardt et al.
(Continued)

FOREIGN PATENT DOCUMENTS

JP 2006129689 A 5/2006

OTHER PUBLICATIONS

Picard, "Under the Hood of Flyback SMPS Designs", Texas Instruments, pp. 1-39 (Year: 2010).

*Primary Examiner* — Pinping Sun
(74) *Attorney, Agent, or Firm* — Brian D. Graham; Charles A. Brill; Frank D. Cimino

(57) ABSTRACT

A system and method for monitoring energy use in an electronic device. In one embodiment, an energy monitoring system includes a processor and an energy monitor module. The energy monitor module includes instructions that when executed cause the processor to receive values of measured parameters of a pulse signal that controls the switching of energy to an energy storage device in a switch mode power supply that provides power to an electronic device. The instructions also cause the processor to determine, based on the values of measured parameters, attributes of operation of the electronic device powered by the energy source during an interval corresponding to the measured parameters. The instructions further cause the processor to generate, based on the attributes of operation, a control signal that causes the electronic device to change the loading of the power supply by the electronic device.

20 Claims, 8 Drawing Sheets

(51) Int. Cl.
*G06F 1/3206* (2019.01)
*G06F 1/324* (2019.01)
*G06F 1/3296* (2019.01)
*G01R 22/10* (2006.01)

(52) U.S. Cl.
CPC .......... *G06F 1/3296* (2013.01); *H02M 3/157* (2013.01); *G01R 22/10* (2013.01); *Y02D 10/00* (2018.01)

(56) References Cited

U.S. PATENT DOCUMENTS

| | | | |
|---|---|---|---|
| 5,784,151 A * | 7/1998 | Miller | A61B 5/1495 356/41 |
| 6,215,288 B1 | 4/2001 | Ramsey et al. | |
| 6,301,135 B1 | 10/2001 | Mammano et al. | |
| 7,102,899 B2 | 9/2006 | Reinhard et al. | |
| 7,350,088 B2 | 3/2008 | Allison et al. | |
| 7,586,767 B1 | 9/2009 | Prodic et al. | |
| 7,768,245 B1 | 8/2010 | De Cremoux | |
| 7,772,811 B1 | 8/2010 | Jain et al. | |
| 7,894,222 B2 | 2/2011 | Djenguerian et al. | |
| 7,898,235 B2 | 3/2011 | Seo | |
| 7,994,762 B2 | 8/2011 | De Cremoux et al. | |
| 8,004,123 B2 | 8/2011 | Hodges et al. | |
| 8,120,341 B2 | 2/2012 | Melanson | |
| 8,125,806 B2 * | 2/2012 | Nangreaves | H02M 7/48 363/95 |
| 8,143,874 B2 | 3/2012 | Templeton | |
| 8,232,787 B2 | 7/2012 | De Cremoux | |
| 8,239,694 B2 | 8/2012 | Saha et al. | |
| 8,254,868 B2 * | 8/2012 | Constien | G06F 1/3203 455/343.1 |
| 8,284,574 B2 | 10/2012 | Chapman et al. | |
| 8,316,127 B2 | 11/2012 | Dahl | |
| 8,407,502 B1 | 3/2013 | Guy et al. | |
| 8,447,541 B2 | 5/2013 | Rada et al. | |
| 9,170,912 B1 | 10/2015 | Hu et al. | |
| 10,707,038 B2 * | 7/2020 | Diewald | H01H 47/00 |
| 2001/0003207 A1 * | 6/2001 | Kling | G06F 1/206 713/320 |
| 2002/0057080 A1 | 5/2002 | Telefus et al. | |
| 2003/0128555 A1 | 7/2003 | Schemmann et al. | |
| 2004/0205365 A1 | 10/2004 | Chou et al. | |
| 2005/0033998 A1 | 2/2005 | Honda et al. | |
| 2007/0108951 A1 * | 5/2007 | Coleman | H02M 3/156 323/282 |
| 2008/0106248 A1 * | 5/2008 | Qahouq | G06F 1/26 323/318 |
| 2008/0265869 A1 | 10/2008 | Babb | |
| 2009/0140710 A1 * | 6/2009 | Matthews | H02M 7/062 323/284 |
| 2009/0267582 A1 * | 10/2009 | Prodic | H02M 3/157 323/283 |
| 2009/0296427 A1 * | 12/2009 | Djenguerian | H02M 3/33507 363/21.12 |
| 2010/0090775 A1 | 4/2010 | Huda et al. | |
| 2010/0218029 A1 | 8/2010 | Floyd et al. | |
| 2011/0040996 A1 | 2/2011 | Hackborn et al. | |
| 2011/0125657 A1 * | 5/2011 | Boss | G06Q 20/145 705/317 |
| 2011/0221405 A1 | 9/2011 | Tang et al. | |
| 2011/0248655 A1 * | 10/2011 | Buchmann | H02M 3/337 318/293 |
| 2012/0010684 A1 * | 1/2012 | Owens | A61B 18/203 607/88 |
| 2012/0068692 A1 * | 3/2012 | Patel | G01R 15/202 324/202 |
| 2012/0139518 A1 | 6/2012 | Cleveland et al. | |
| 2012/0274479 A1 | 11/2012 | Moon et al. | |
| 2013/0063102 A1 * | 3/2013 | Chen | H02M 3/157 323/234 |
| 2013/0073883 A1 * | 3/2013 | Vick | G06F 1/32 713/320 |
| 2013/0093242 A1 | 4/2013 | Mok et al. | |
| 2013/0116953 A1 | 5/2013 | Pollard et al. | |
| 2013/0154594 A1 | 6/2013 | Zipperer et al. | |
| 2013/0253720 A1 | 9/2013 | Luo et al. | |
| 2014/0333281 A1 * | 11/2014 | Li | G01R 21/00 323/318 |
| 2014/0347100 A1 | 11/2014 | Seveau et al. | |
| 2014/0355698 A1 * | 12/2014 | Morand | B60L 53/66 375/257 |
| 2014/0362612 A1 | 12/2014 | Shi et al. | |
| 2015/0256062 A1 * | 9/2015 | Shirahata | H02J 7/345 323/304 |
| 2016/0048197 A1 | 2/2016 | Hanssen et al. | |

* cited by examiner

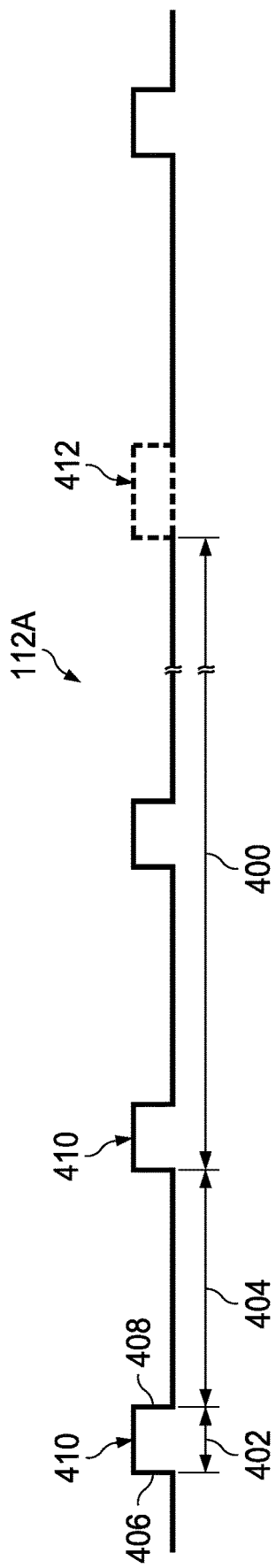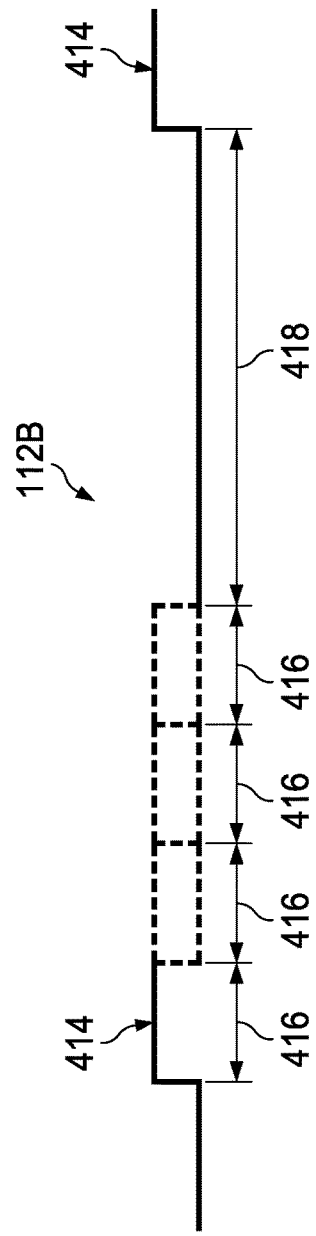

SYSTEM AND METHOD FOR ENERGY MONITORING

CROSS-REFERENCE TO RELATED APPLICATIONS

This application is a continuation of U.S. patent application Ser. No. 14/020,184, filed Sep. 6, 2013, which is incorporated by reference herein in its entirety.

BACKGROUND

As mobile electronic devices and systems increase in number, techniques for reducing energy consumption become increasingly important. Mobile electronic systems are typically powered by batteries or other energy sources of limited capacity. Complex power management schemes may be employed in an attempt to reduce the energy consumption of the electronic device and extend the operational life of the energy source. Such power management schemes can be facilitated by accurate real-time measurement of the energy consumed by the device over a wide range of energy use. For example, energy consumption in a mobile device may vary over a range of up to six orders of magnitude or more, and efficient management of energy consumption in the device may require accurate measurement of energy consumption over the entire range.

SUMMARY

Systems and methods for tracking, monitoring, and controlling energy consumption in electronic systems are disclosed herein. In one embodiment, an energy monitoring system includes a processor and an energy monitor module. The energy monitor module includes instructions that when executed cause the processor to receive values of measured parameters of a pulse signal that controls the switching of energy to an energy storage device in a switch mode power supply that provides power to an electronic device. The instructions also cause the processor to determine, based on the values of measured parameters, attributes of operation of the electronic device powered by the energy source during an interval corresponding to the measured parameters. The instructions further cause the processor to generate, based on the attributes of operation, a control signal that causes the electronic device to change loading of the power supply by the electronic device.

In another embodiment, a method includes tracking energy provided from a switching power supply to power an electronic device by measuring parameters of a pulse signal that controls switching of energy to an energy storage device in the power supply. Attributes of operation of the electronic device powered by the power supply during an interval corresponding to the measured parameters are determined based on the values of measured parameters.

In yet another embodiment, a system includes an energy source, an energy tracking system, and an energy monitoring system. The energy source is configured to maintain a desired output voltage by switching energy to a storage device based on a power supply output voltage of the energy source. The energy tracking system is coupled to the energy source. The energy tracking system is configured to measure parameters of a signal that controls switching of energy to the storage device in the energy source, and to report values of the measured parameters. The energy monitoring system is coupled to the energy tracking system. The energy monitoring system is configured to receive the values of the measured parameters, and to determine, based on the values of measured parameters, attributes of operation of electronic circuitry powered by the energy source during an interval corresponding to the measured parameters.

BRIEF DESCRIPTION OF THE DRAWINGS

For a detailed description of exemplary embodiments of the invention, reference will now be made to the accompanying drawings in which:

FIGS. 4A-4B show illustrative pulse signals generated by a switching power supply and measured by an energy tracking system in accordance with principles disclosed herein.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections. The recitation "based on" is intended to mean "based at least in part on." Therefore, if X is based on Y, X may be based on Y and any number of additional factors.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Conventional electronic systems apply various measurement techniques to determine the amount of energy consumed by a component or portion of the system. For example, energy may be provided to a portion of the system via a shunt, and voltage across the shunt may be measured to determine the current flowing to the portion of the system. Unfortunately, such measurement techniques can detrimentally affect system efficiency and operational life, and a wide range of voltage values may be difficult to measure accurately.

Embodiments of the energy tracking and control systems disclosed herein allow energy consumed by an electronic circuit to be measured without interfering with circuit operation or reducing the efficiency of the circuit. The energy tracking system disclosed herein measures the parameters of a pulse signal that controls transfer of energy in a switching power supply. The energy consumed by an electronic circuit powered by the power supply can be determined from the measured parameters. Energy control systems disclosed herein apply the measured parameters to adjust the operation and energy consumption of the circuit.

Figure 1:
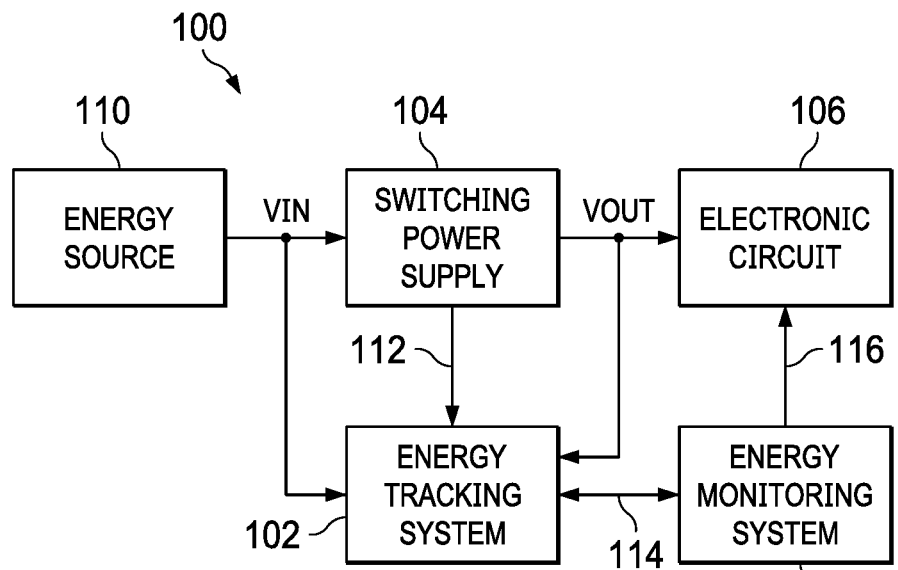
FIG. 1 shows a block diagram of a system including energy tracking and control in accordance with principles disclosed herein.

FIG. 1 shows a block diagram of a system 100 including energy tracking and control in accordance with principles disclosed herein. The system 100 includes an energy source 110, a switching power supply 104, an electronic circuit 106, an energy tracking system 102, and an energy monitoring system 108. The energy source 110 powers the system 100 and may be a direct current (DC) power source such as a battery or an energy harvesting system, such as a photovoltaic cell. The energy source 110 is coupled to the switching power supply 104. The switching power supply 104 is DC-DC converter that generates from voltage VIN provided by the energy source 110, a different voltage VOUT. The voltage VOUT may be higher or lower than the voltage VIN.

The electronic circuit 106 is coupled to the output of the switching power supply 104 and is powered by VOUT generated by the switching power supply 104. The electronic circuit 106 may include a processor, such as a microprocessor, a digital signal processor, a microcontroller, and/or other circuitry. In some embodiments, the electronic circuit 106 may be processor (e.g., a microcontroller).

The energy tracking system 102 is coupled to the switching power supply 104. The energy tracking system 104 receives a pulse signal 112 generated by the switching power supply 104, and measures various parameters of the signal 112. In the switching power supply 104, the signal 112 controls the transfer of energy to an energy storage device that provides energy to the electronic circuit 106. The parameters of the signal 112, measured by the energy tracking system 102, are indicative of the amount of energy transferred to and consumed by the electronic circuit 106. Thus, the energy tracking system 102 provides measurement of the energy transferred to the electronic circuit 106, and the measurement does not affect VOUT or the operation or efficiency of the switching power supply 104 or the electronic circuit 106. The energy tracking system 102 also measures the voltages VIN and VOUT.

In some embodiments of the system 100, the electronic circuit 106 and the energy tracking system 102 may be included on the same integrated circuit. The energy tracking system 102 may applied as part of a debugging system that allows the power consumed by the electronic circuit 106 to be tracked during development of the electronic circuit 106 or development of software programming to be executed by the electronic circuit 106.

The energy monitoring system 108 is coupled to the energy tracking system 102. The energy monitoring system 108 receives, from the energy tracking system 102, values of the parameters of the signal 112 measured by the energy tracking system 102, and other information produced by the energy tracking system 102 that is relevant to the energy consumed by the electronic circuit 106. The energy monitoring system 108 processes the information received from the energy tracking system 102, and determines how much energy is being consumed by the electronic circuit 106.

In some embodiments of the system 100, the energy monitoring system 108 is coupled to the electronic circuit 106. Based on the determination of energy used by the electronic circuit 106, the energy monitoring system 108 can control the operation of the electronic circuit 106. For example, if the energy monitoring circuit 108 determines that the rate of energy use by the electronic circuit is too high, the energy monitoring circuit 108 may cause the electronic circuit 106 to reduce its power consumption by causing an adjustment in operation (e.g., a change in power mode, clock frequency, etc.).

Figure 2:
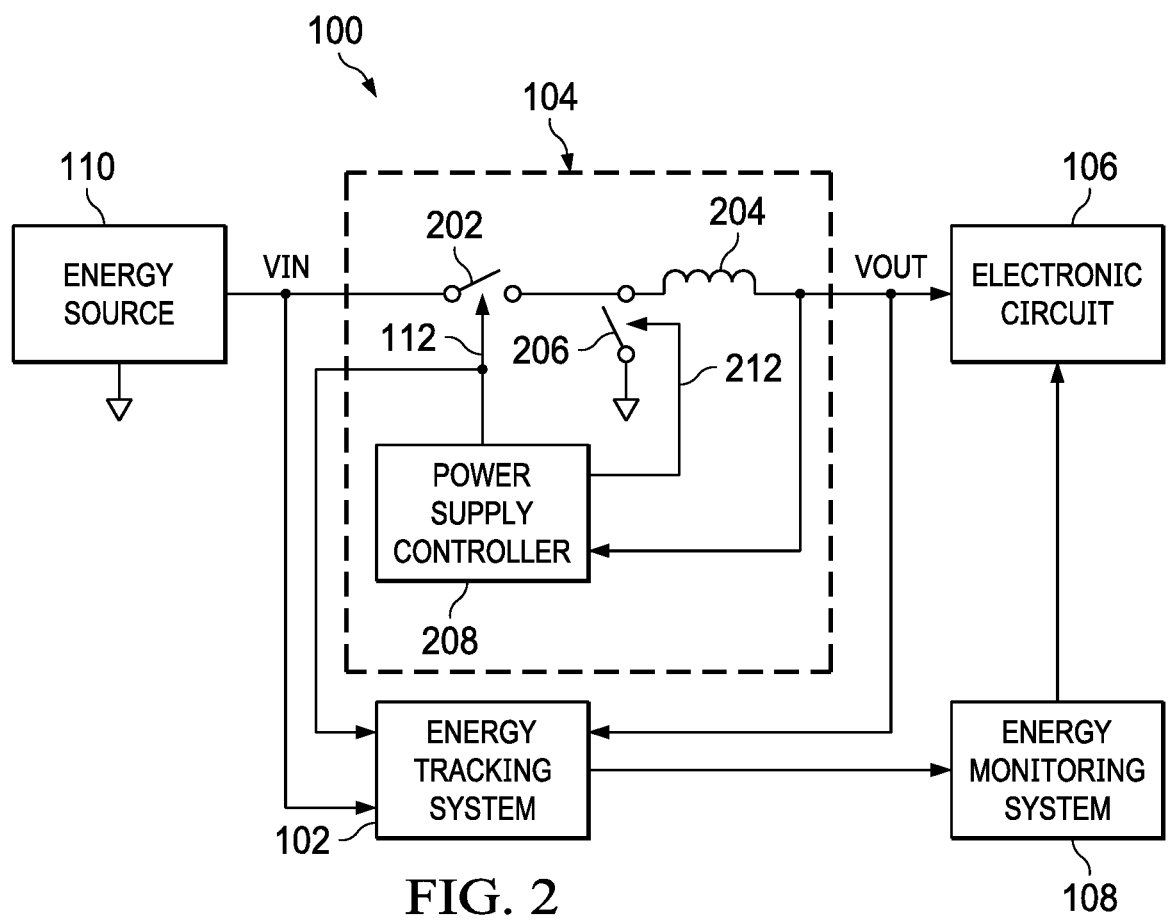
FIG. 2 shows the block diagram of FIG. 1 with schematic depiction of the switching power supply in accordance with principles disclosed herein.

FIG. 2 shows the block diagram of FIG. 1 with schematic details of the switching power supply 104. In FIG. 2, the power supply 104 is depicted as a buck converter. In other embodiments, the power supply 104 may be a boost converter, a buck-boost converter, etc. The power supply 104 includes switches 202 and 206, and inductor 204. The inductor 204 serves as the energy storage device that transfers energy from the switching power supply 104 to the electronic circuit 106. Various components of the switching power supply 104 have been omitted in the interest of clarity.

The switch 202 controls transfer of energy from the energy source 102 to the inductor 104. Each of the switches 202, 206 is open when the other closed. The power supply controller 208 controls the switches 202, 206 to maintain VOUT at a predetermined voltage. The power supply controller 208 monitors VOUT and generates the pulse signals 112 and 212 to control the operation of the switches 202 and 206 respectively. When VOUT drops below a predetermined voltage, the controller 208 asserts the signal 112 to close switch 202 and transfer energy to the inductor 204. Accordingly, the parameters of the signal 112 are indicative of the amount of energy transferred into the inductor 204, and the electronic circuit 106. The power supply controller 208 includes pulse generation circuitry to generate the pulse signals 112, 212, and analog comparison circuitry to compare VOUT to a reference voltage for determination of when a pulse is to be generated on the signal 112.

Figure 3:
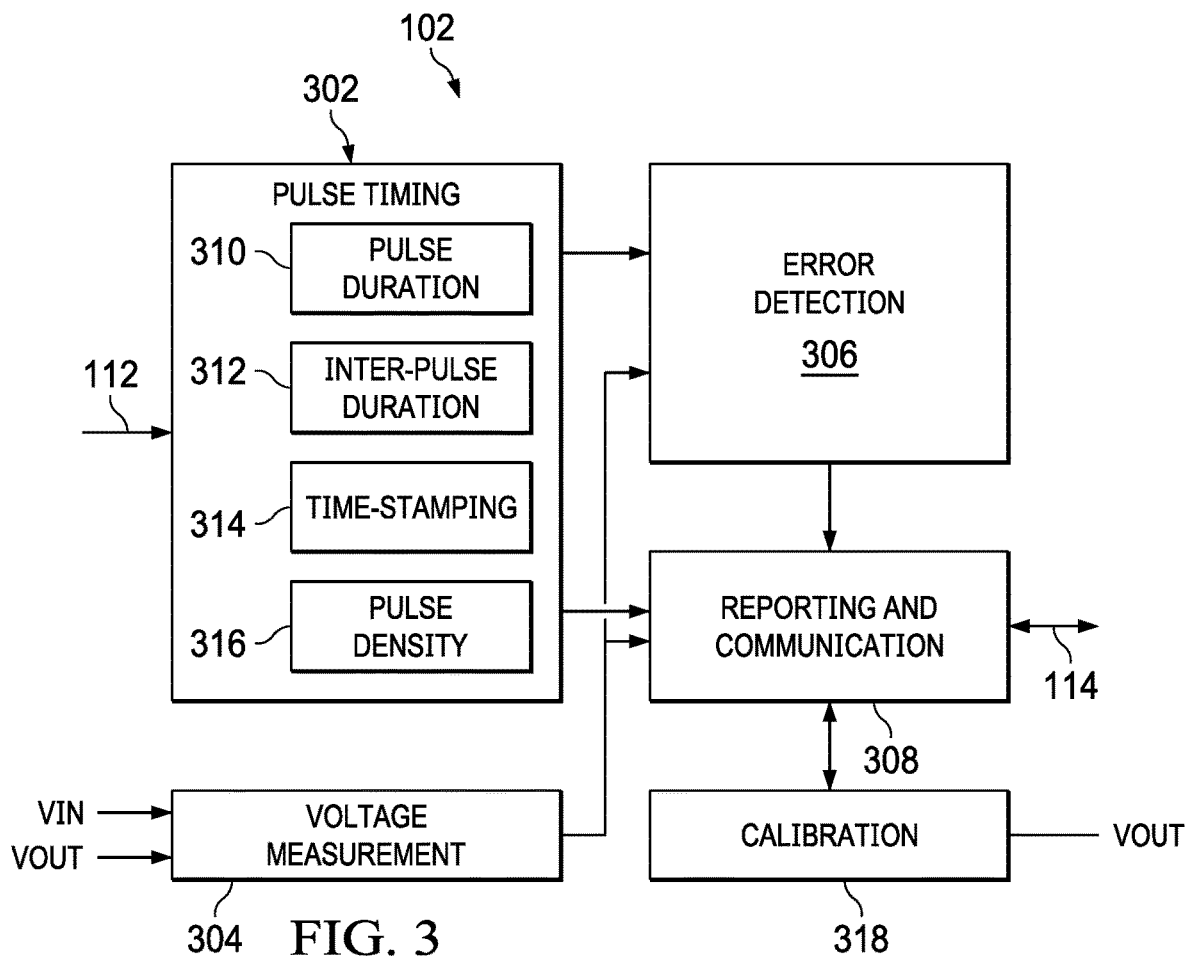
FIG. 3 shows a block diagram of an energy tracking system in accordance with principles disclosed herein.

FIG. 3 shows a block diagram of an embodiment of the energy tracking system 102. The energy tracking system 102 includes pulse timing logic 302, voltage measurement circuitry 304, error detection logic 306, reporting and communication logic 308, and calibration circuitry 318. The pulse timing logic 302 measures the parameters of the pulse signal 112 that controls the switch 202 of the switching power supply 104. The pulse timing logic 302 includes pulse duration measurement logic 310, inter-pulse duration measurement logic 312, pulse time-stamping logic 314, and pulse density determination logic 316.

FIGS. 4A and 4B show illustrative pulse signals 112A and 112B (embodiments of signal 112) generated by the switching power supply 104 and measured by the energy tracking system 102. FIG. 4A shows a first embodiment of a pulse signal 112A. The pulse signal 112A includes pulses 410, each of which may be of a same duration 402. The switch 202 is closed for the duration 402 to transfer energy to the inductor 204. The pulses 410 are separated by inter-pulse period 404, which may be uniform between all pulses 410. When VOUT is sufficiently high that no transfer of energy from the energy source 110 to the inductor 204 is needed, then the power supply controller 208 may not generate a pulse 410 at a designated time (i.e., may skip a pulse 410). The reference designator 412 illustrates skipping of a pulse 410 in the signal 112A.

In some embodiments, the duration of the pulses of the signal 112 may vary. FIG. 4B shows one embodiment of a signal 112B including a variable duration pulse 414 for use with the energy tracking system 102. The pulse 414 has duration equal to an integer multiple of minimum pulse duration 416. Thus, the pulse 414 may have a duration of one, two, three, or four times the duration 416. Pulses 414 are separated by interval 418 which may vary with the duration of the pulses 414. In some embodiments, the interval 418 may be an integer multiple of a predetermined minimum inter-pulse interval.

Returning now to the pulse timing logic 302, the pulse duration measurement logic 310 measures pulse duration 402, i.e., the duration of energy transfer to the inductor 204. The inter-pulse duration measurement logic 312 measures the inter-pulse interval 404. The time-stamping logic 314 assigns time stamp values to the pulses 410. For example, at least one time stamp value may be recorded for each pulse 410. In some embodiments, a time stamp value may be recorded for the leading edge 406 of the pulse 410. A time value may also be recorded for the trailing edge 408 of the pulse 410.

Based on the measurements of pulse durations 402 and 404, the pulse density logic 314 computes the pulse density for the signal 112 over a predetermined interval. The pulse density logic 314 may compute a minimum pulse density value for pulses detected during the interval and a maximum pulse density value for pulses detected during the interval. The interval may be measured by time, number of pulses, etc. In some embodiments, the pulse timing logic 302 may apply synchronous intervals of measurement, for example, intervals over which pulse parameters are measured may be synchronous with the pulses 410. Interval 400 illustrates a measurement interval that is synchronous with pulses 410. Other measurement intervals applied by the pulse timing logic 302 may asynchronous with respect to the pulses 410.

The pulse timing logic 302 may also count the number of pulses 410 occurring with a measurement interval. The pulse timing logic 302 may include clock signal generators, timers, computational logic, etc. arranged to measure pulse 410 timing parameters, generate pulse measurement intervals, generate and record time stamp values, compute pulse density values, perform other pulse timing functions disclosed herein.

The voltage measurement circuitry 304 measures the value of the input voltage VIN provided to the switching power supply 104, and measures the value of the output voltage VOUT generated by the switching power supply 104. The voltage measurement circuitry 304 may also compute the difference between VIN and VOUT. The voltage measurement circuitry 304 may include an analog-to-digital converter, voltage scaling circuitry, signal multiplexing circuitry, digital voltage value storage, computational logic, etc.

The error detection logic 306 compares the parameter timing values generated by the pulse timing logic 302 to various predetermined timing limits to determine whether an error in the timing of the pulse signal 112 has occurred. For example, the error detection logic 306 may compare the measured pulse duration 402 to a minimum and maximum allowable pulse width values. If the pulse duration 402 is less than the minimum allowable pulse width or greater than the maximum allowable pulse width, then the error detection logic 306 may record a pulse width error. If an interval between successive pulses exceeds a predetermined maximum inter-pulse interval, then the error detection logic 306 may flag an error. If the number of pulses 410 detected in an interval exceeds a predetermined maximum number, then the error detection logic 306 may record an error.

The error detection logic 306 may also compare values of VIN and VOUT generated by the voltage measurement circuitry 304 to maximum and minimum values established for each of VIN and VOUT. If VIN or VOUT is less than the corresponding minimum value or greater than the corresponding maximum value, then the error detection logic 306 may record an error with respect to VIN or VOUT. Similarly, if the difference between VIN and VOUT exceeds a predetermined maximum difference value, then the error detection logic 306 may record an error.

The error detection logic 306 can also identify an overcurrent condition by determining whether the number of detected pulses in the signal 112 in a predetermined interval exceeds a predetermined maximum number of pulses.

The calibration circuitry 318 is coupled to the output of the switching power supply 104, and selectably connects a known load to the switching power supply 104. When the known load is connected to the switching power supply 104, and the electronic circuit 106 is disconnected from the switching power supply 104, the timing of the pulse signal 112 (e.g., pulse duration, inter-pulse interval) generated by the power supply controller 208 corresponds to the current flowing through the known load at voltage VOUT. Thus, connecting the known load to VOUT and measuring the resulting parameters of the pulse signal 112 provides reference information that can be used to accurately determine the amount of energy transferred by the pulses 410.

If the electronic circuit 106 is not disconnected from the switching power supply 104 while the known calibration load is connected, the change in timing of the pulse signals 112 due to addition of the known load also provides reference information for determining the energy transferred by each pulse 410.

Figure 5:
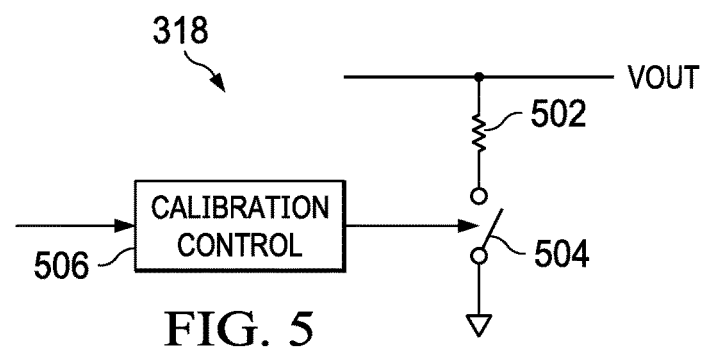
FIG. 5 shows a schematic diagram of calibration circuitry included in an energy tracking system in accordance with principles disclosed herein.

FIG. 5 shows a schematic diagram of the calibration circuitry 318. The calibration circuitry 318 includes a load resistor 502 having known resistance, a switch 504, and calibration control logic 506. The switch 504 is closed and opened to connect and disconnect the load resistor 502 to the output of the switching power supply 104. The calibration control logic 506 controls the switch 504. The calibration control logic 506 may connect and disconnect the load resistor 502 from VOUT in synchronization with the pulses 410 (e.g., the trailing edges of the pulses 410).

The reporting and communication logic 308 provides an interface for communicating the values of the pulse signal parameters measured by the pulse timing logic 302, the voltage values measured by the voltage measurement circuitry, and the errors detected by the error detection logic 306 to other systems and devices. The reporting and communication logic 308 also allows the energy tracking system 102 to receive commands and operational parameters from external systems and devices.

For fixed length pulses 410, the reporting and communication logic 308 can report pulse interval information in a variety of formats. Pulse parameter values may be reported as timing and duration values, time stamp values, etc. For fixed interval pulses 410, the reporting and communication logic 308 can report whether a pulse 410 is detected at each interval. For variable duration pulses 414, the reporting and communication logic 308 can report a value indicative of the integer multiplicand of duration 416 that defines the pulse duration. The reporting and communication logic 308 can also report a number of pulses 410 detected in a measurement interval, timestamps of pulses 410, values parameter of pulses 410 measured while calibration load 502 is connected to VOUT.

In embodiments of the energy tracking system 102, the some of the functionality described herein may be provided by a processor executing software instructions, or by dedicated circuitry, or a combination of a processor and dedicated circuitry.

Returning again to FIG. 1, the energy monitoring system 108 may be communicatively coupled to the energy tracking system 102 via signals 114. The reporting and communication logic 308 of the energy tracking system 102 provides various values of timing parameters of the signal 112, error information, voltage measurements, calibration information, and other information disclosed herein to the energy monitoring system 108. The energy monitoring system 108 may provide command and operational parameter information to the energy tracking system 102 via the signals 114. In some embodiments, the energy monitoring system 108 may be a component of a debugging system applied to provide information about the power consumed by the electronic circuit 106 during operation.

Figure 6:
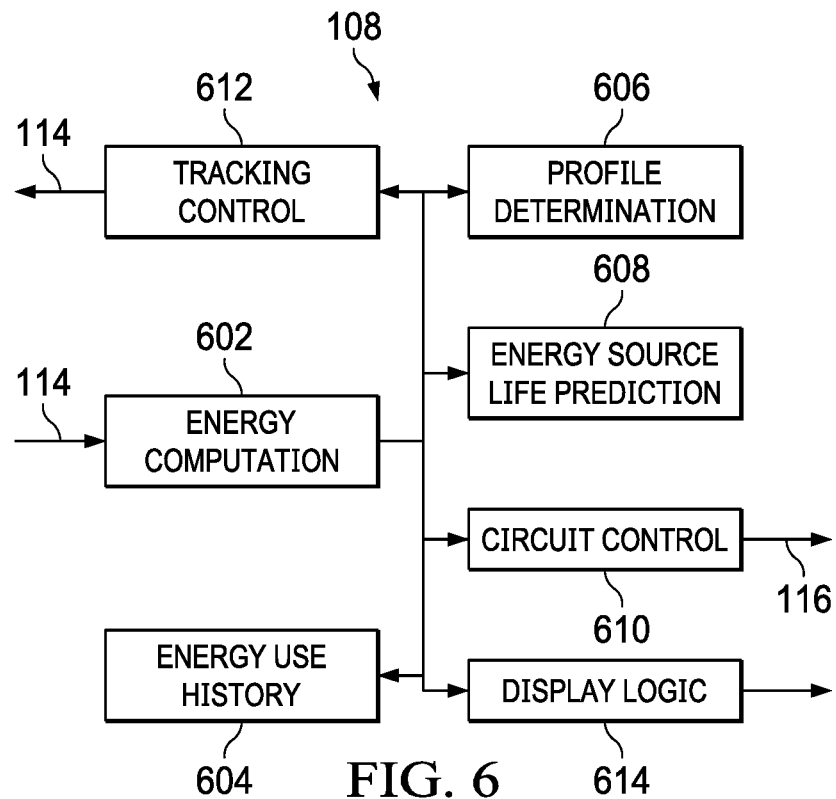
FIG. 6 shows a block diagram of an energy monitoring system in accordance with principles disclosed herein.

FIG. 6 shows a block diagram of an embodiment of the energy monitoring system 108. The energy monitoring system 108 includes energy computation logic 602, energy use history logic 604, profile determination logic 606, energy source life prediction logic 608, electronic circuit control logic 610, energy tracking control logic 612, and display logic 614. Based on the values of the parameters of the switching signal 112 received from the energy tracking system 102, the energy monitoring system 108 determines various attributes of operation of electronic circuitry 106, the energy source 110, etc.

The energy computation logic 602 receives the values of parameters of the switching signal 112 as measured and provided by the energy tracking system 102, and processes the values to determine how much energy is being used by the electronic circuit 106. Based on parameters of the signal 112 measured while the calibration load 502 is connected to VOUT, the energy computation logic 602 can determine an energy transfer to pulse duration reference, and apply the reference to determine how much energy is being transferred to the electronic circuit 106 with each pulse 410 measured by the energy tracking system 102. The energy computation logic 602 can provide the computed per pulse energy values to other logic of the energy monitoring system 108 to facilitate further analysis of the energy used by the electronic system 108.

The energy use history logic 604 can process and/or record the per pulse energy transfers to determine how much energy has been used by the electronic circuit 106 over time.

The profile determination logic 606 may identify patterns of energy use in the per pulse energy transfers where the patterns define a profile of the electronic circuit 106. For example, an energy use pattern identified by the profile determination logic 606 may indicate periodic short term increased energy consumption indicating periodic interrupt servicing or loop-based processing. The profile determination logic 606 may also identify other attributes of operation of the electronic circuit 106 based on changes and/or differences in energy use. The profile determination logic 606 may identify various operational power modes of the electronic circuit 106, timing of interrupt events, timing of loop execution, changes in activity level, a load factor for the electronic circuit 106, changes in loading, and/or current leakage in the electronic circuit 106.

The profile determination logic 606 can apply various filter functions to the energy use data derived from the pulses 410. The filtering may include low-pass filtering, high-pass filtering, moving average computation, constant phase delay filtering, outlier handling, etc. Undersampling and/or oversampling may be applied. Identified instances of power use pattern repetition may be summed to reduce noise.

The energy source life prediction logic 608 estimates the operational life of the energy source 110 based on the rate of energy drain extrapolated from the computed per pulse energy transfers.

The circuit control logic 610 can change the operation of the electronic circuit 106 via assertion of the control signal 116. For example, if the circuit control logic 610 determines that the electronic circuit 106 is consuming energy at too high a rate (at a rate that is higher than a predetermined maximum rate), the circuit control logic 610 may, via assertion of the signal 116, cause the electronic circuit 106 reduce loading of the switching power supply 104 by reducing the rate of energy consumed. The control signal 116 may cause by the electronic circuit 106 to reduce energy use by causing the electronic circuit 106 to reduce the number and/or accuracy of computations applied to data, to reduce a clock frequency or processing rate, etc.

The tracking control logic 612 provides command and operational parameter values to the energy tracking system 102. The tracking control logic 612 may cause the energy tracking system 102 to connect the calibration load 502 to VOUT at a given time for acquiring reference data, or to acquire pulse 410 parameter data at or for a specific time. The tracking control logic 612 communicates to the energy tracking system 102 information specifying whether calibration or pulse parameter acquisition is to be synchronized with the pulses 410.

The display logic 614 generates displays of the information provided by the energy computation logic 602, energy use history logic, profile determination logic 606, energy source life prediction logic 608, and other logic of the energy monitoring system 108 for presentation to a user of the energy monitoring system 108.

Figure 7:
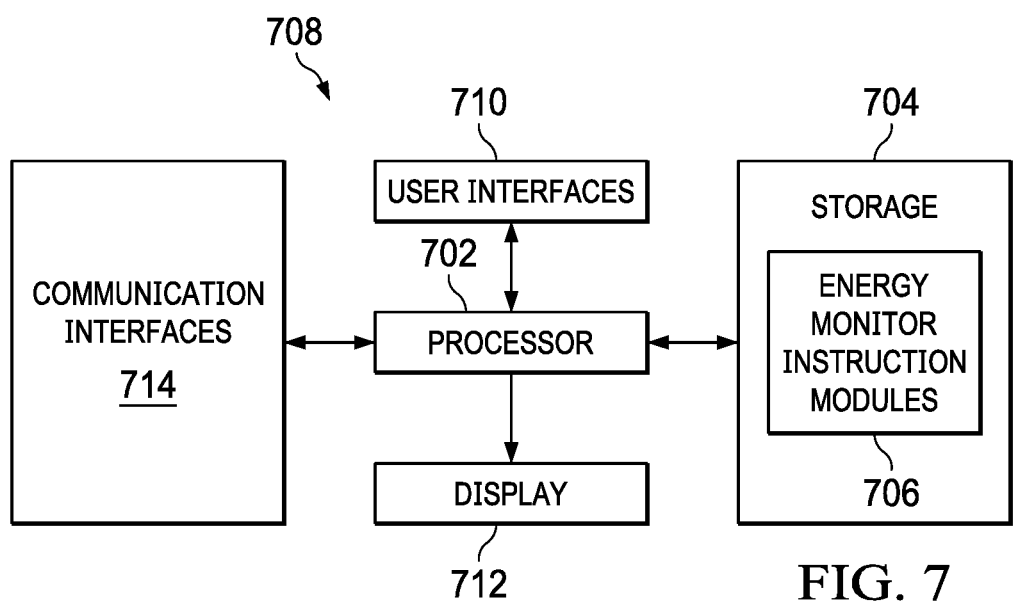
FIG. 7 shows a block diagram of a processor-based energy monitoring system in accordance with principles disclosed herein.

FIG. 7 shows a block diagram of a processor-based energy monitoring system 708. The processor-based energy monitoring system 708 performs the various functions described herein as performed by the energy monitoring system 108 via execution of instructions by a processor. The energy monitoring system 708 includes a processor 702, storage 704, communication interfaces 714, user interfaces 710, and display 712. The energy monitoring system 708 may be implemented via a computer device, such as a desktop computer, a notebook computer, a tablet computer, a smartphone, etc.

The processor 702 may be a general-purpose microprocessor, digital signal processor, microcontroller, or other device capable of executing instructions retrieved from a computer-readable storage medium. Processor architectures generally include execution units (e.g., fixed point, floating point, integer, etc.), storage (e.g., registers, memory, etc.), instruction decoding, peripherals (e.g., interrupt controllers, timers, direct memory access controllers, etc.), input/output systems (e.g., serial ports, parallel ports, etc.) and various other components and sub-systems.

The storage 704 is a non-transitory computer-readable storage medium suitable for storing instructions executable by the processor 702. The storage 704 may include volatile storage such as random access memory, non-volatile storage (e.g., a hard drive, an optical storage device (e.g., CD or DVD), FLASH storage, read-only-memory), or combinations thereof.

The storage 704 includes modules 706 of instructions that are executed by the processor 702 to perform the functions described herein with regard to the energy monitoring system 108. For example, the storage 204 may include an energy computation module, a profile determination module, an energy source life prediction module, a circuit control module, a tracking control module, an energy use history module, a display generation module, etc.

The display 712 is coupled to the processor 702. The processor 702 provides data to the display 712 for presentation. The display 712 may include a liquid crystal display device, an organic light emitting diode display device, or any other display device suitable for displaying energy use information generated by the energy monitoring system 708.

The user interfaces 710 are coupled to the processor 702, and may include various devices and sub-systems that provide for user entry of information. The user interfaces 710 may include a keyboard, a mouse, a trackball, or other user entry devices.

The communication interfaces 714 communicatively couple the energy monitoring system 708 to the energy tracking system 102 and the electronic device 106.

Figure 8:
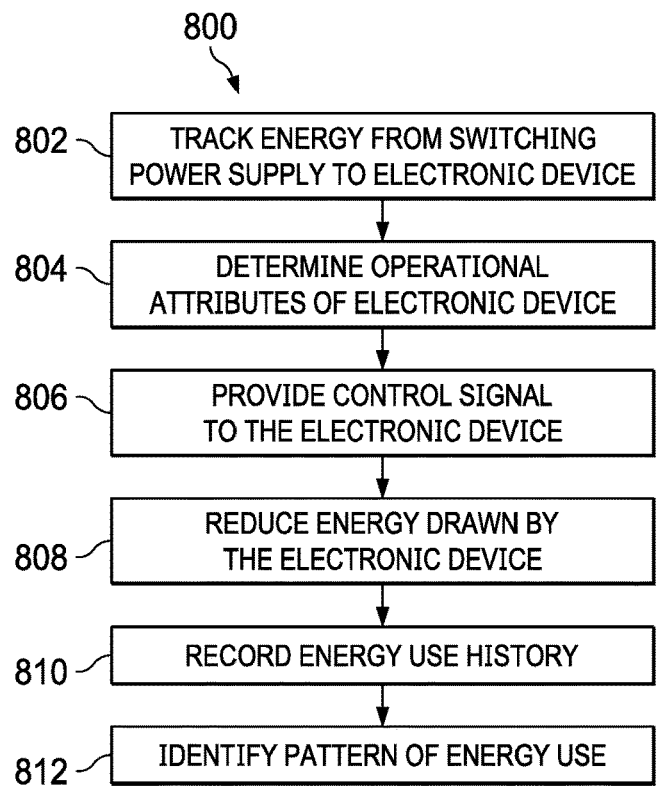
FIG. 8 shows a flow diagram for a method for monitoring energy use in accordance with principles disclosed herein.

FIG. 8 shows a flow diagram for a method 800 for monitoring energy use in accordance with principles disclosed herein. Though depicted sequentially as a matter of convenience, at least some of the actions shown can be performed in a different order and/or performed in parallel. Additionally, some embodiments may perform only some of the actions shown. In some embodiments, at least some of the operations of the method 800, as well as other operations described herein, can be implemented as instructions stored in a computer readable medium and executed by one or more processors.

In block 802, the electronic device 106 is operating and is drawing energy from the switching power supply 104. The energy tracking system 102 is measuring the pulses of the signal 112 to track the energy transferred to the electronic circuit 106.

In block 804, the energy monitoring system 108 receives the values measured by the energy tracking system 102, processes the values, and determines, based on the values, operational attributes of the electronic circuit 106. The attributes include the energy consumed by the electronic circuit 108. Based on the energy consumed, the energy monitoring system may determine other attributes of operation of the electronic circuit 106.

In block 806, the energy monitoring system 108 determines, based on the energy use of the electronic circuit 106, that the energy consumption of the electronic circuit should be reduced. For example, if the energy source 110 is an energy harvesting system, then the energy used by the electronic circuit 106 may exceed the energy provided by the energy source 110. If the energy source 110 is a battery, then the level of energy used by the electronic circuit 106 may deplete the battery in a shorter time than is desirable. The energy monitoring system 108 asserts a signal 116 to the electronic device 106. The signal 116 causes the electronic circuit 106 to change its operation.

In block 808, responsive to the signal 116, the electronic circuit 106 reduces the energy drawn from the energy source 110. For example, the signal 116 may cause the electronic circuit 106 to change power modes, reduce clock frequency, reduce or change applied computations, etc. thereby reducing the energy consumed by the electronic device 106.

In block 810, the energy monitoring system 108 records the energy used by the electronic circuit 106 and compiles a record of the history of energy use by the electronic circuit 106.

In block 812, the energy monitoring system 108 analyzes the recorded energy use of the electronic circuit 106 and identifies a pattern of energy use that characterizes the electronic device 106. The energy monitoring system 108 may also display information indicative of the various attributes of the electronic system 106, such as energy use history, instantaneous energy use, energy use patterns, etc.

Figure 9:
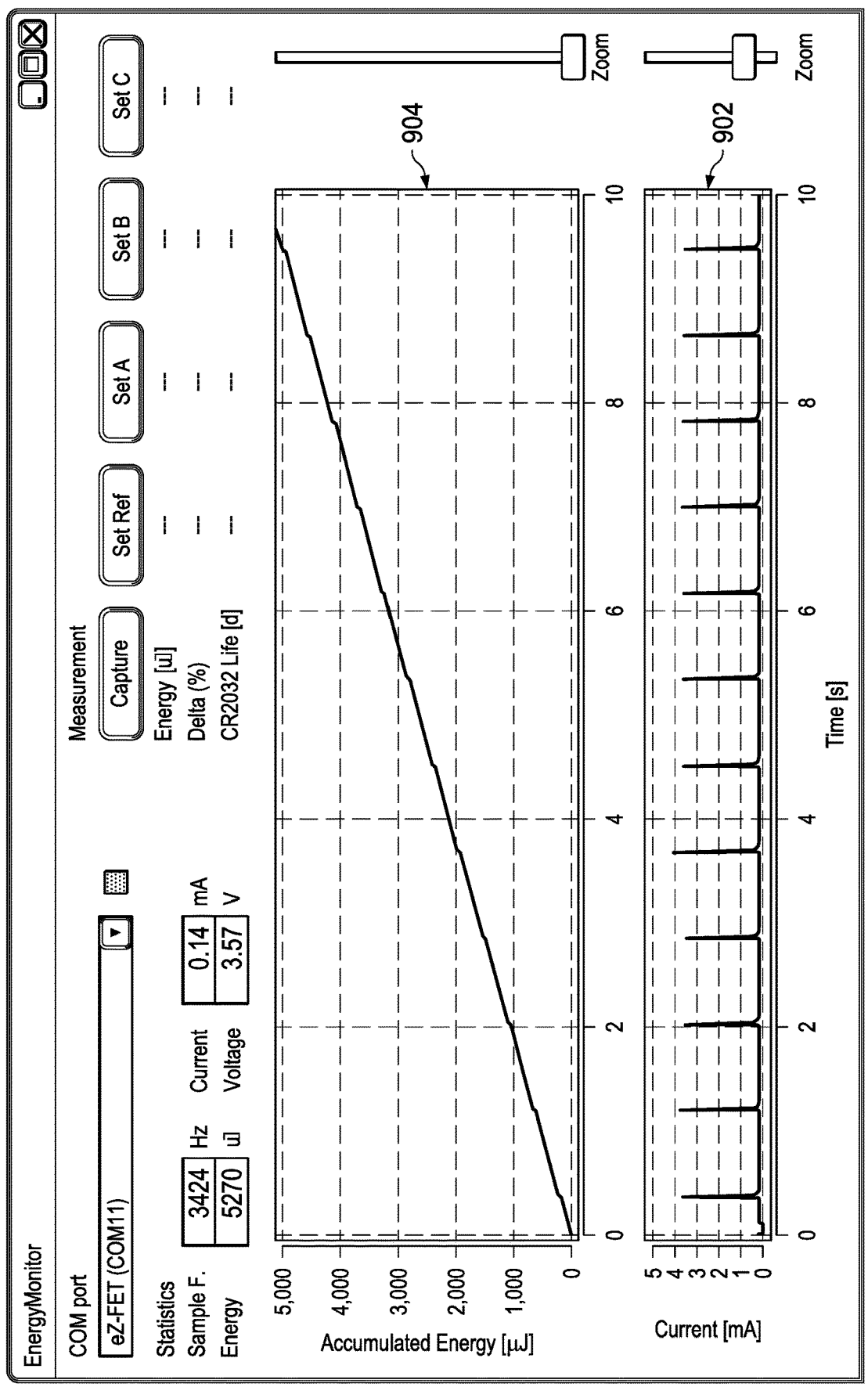
FIG. 9 shows an example of a dialog displayed by an energy monitoring system in accordance with principles disclosed herein.

FIG. 9 shows an example of a dialog displayed by the energy monitoring system 108. The dialog shows instantaneous energy use 902 by the electronic circuit 106, accumulated energy use 904 attributable to the displayed interval of instantaneous energy use 102, and various other parameters of energy use by the electronic circuit 106.

Figure 10:
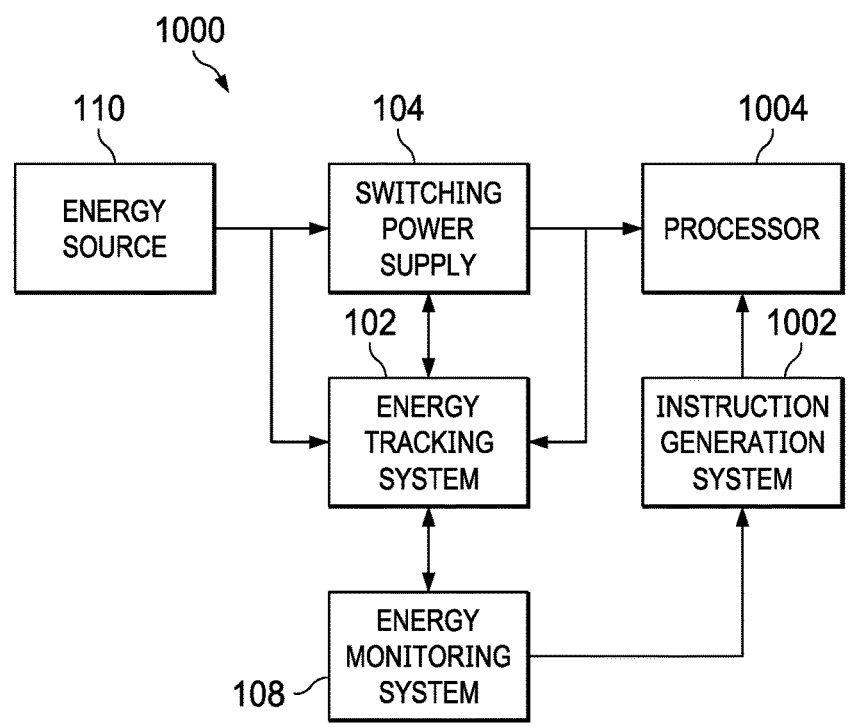
FIG. 10 shows a block diagram of a system for energy cognizant software development in accordance with principles disclosed herein.

While embodiments of the system 100 disclosed herein allow for run-time control and adjustment of energy use by the electronic circuit 106, other embodiments include build time optimization of energy use. FIG. 10 shows a block diagram of a system 1000 for energy cognizant software development in accordance with principles disclosed herein. The system 1000 is similar to the system 100 and in addition to the components of system 100 includes an instruction generation system 1002. The electronic circuit 106 is specified to be the processor 1004.

The instruction generation system 1002 is coupled to the energy monitoring system 108 and the processor 1004. The instruction generation system 1002 receives information detailing energy used by the processor 1004 while executing a program, and generates a revised version of the program that adjusts the energy used by the processor 1004 with the intent of causing processor energy use to fall within a predetermined range of energy use. The instruction generation system 1002 iteratively adjusts program and/or code generation parameters to identify a version of the program that when executed results in execution timing and energy use by the processor 1004 that most closely conforms to the predetermined (e.g., user specified) range values.

Figure 11:
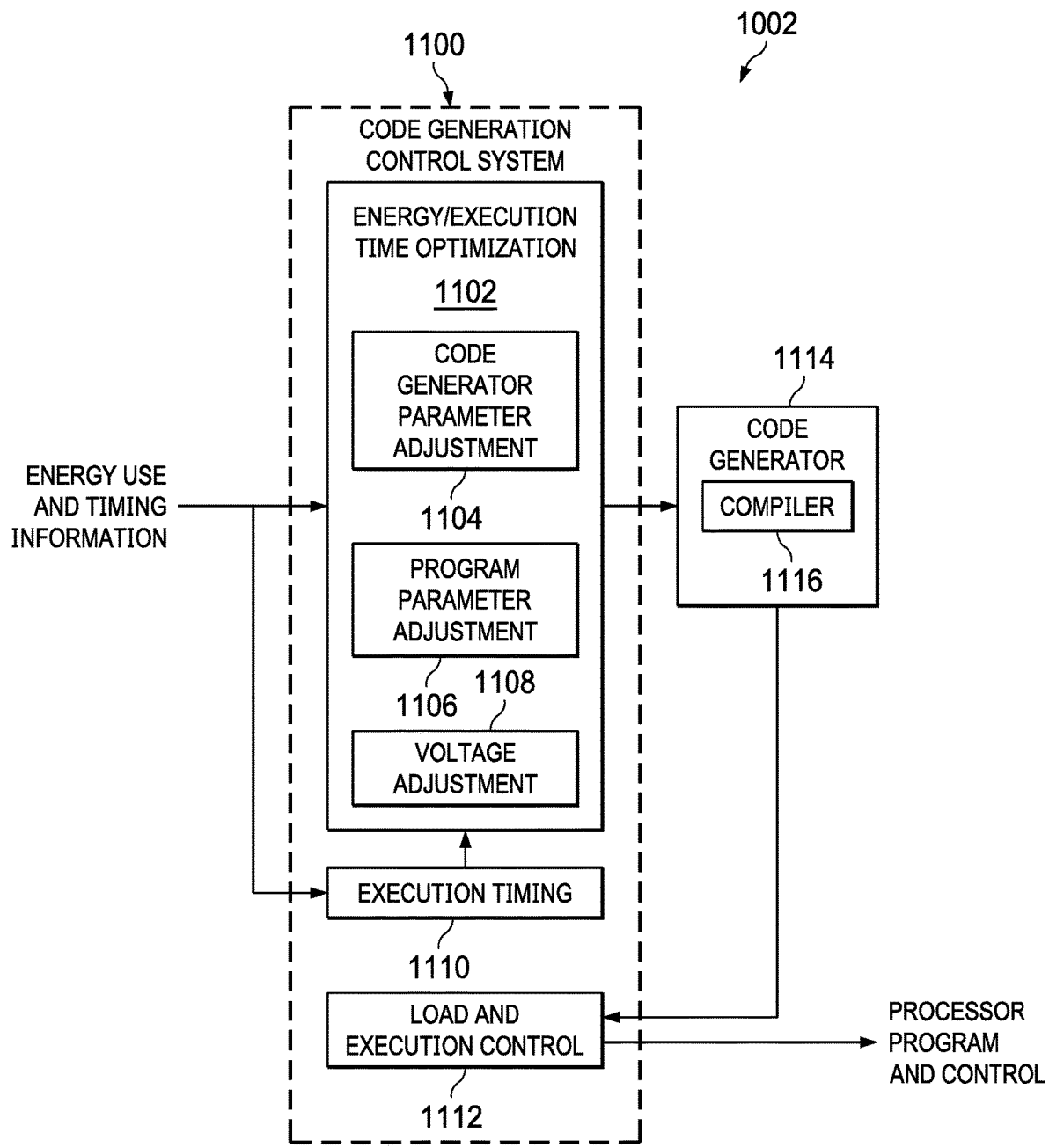
FIG. 11 shows a block diagram of a instruction generation system for energy cognizant software development in accordance with principles disclosed herein.

FIG. 11 shows a block diagram of an instruction generation system 1002. The instruction generation system 1002 includes a code generation control system 1100 and a code generator 1114. The code generator 1114 includes a compiler 1116, assembler, or other tool for generation of instruction sequences executable by the processor 1004. The code generation control system 1100 controls the code generator 1114, downloads executable programs into the processor 1004, and evaluates the energy use and execution time resulting from execution of the program.

The code generation control system 1100 includes an energy/execution time optimization controller 1102, an execution timer 1110, and a load and execution controller 1112. The load and execution controller 1112 downloads a program to be executed into the processor 1004 and initiates execution of the downloaded program by the processor 1004.

The execution timer 1110 times the execution of the downloaded program or of a particular portion of downloaded program. Execution timing may be based on processor power levels indicative of start and end of execution, or based on signals received from the processor 1004 that indicate beginning and/or end of execution, or by other techniques of timing program execution.

The energy/execution time optimization controller 1102 includes code generator parameter adjustment 1104, program parameter adjustment 1106, and voltage adjustment 1108. The energy/execution time optimization controller 1102 receives energy use information corresponding to execution of the program from the energy monitoring system 108, and receives execution timing information from the execution timer 1110, and compares the execution time and energy use to predetermined execution time and energy range values. If the execution time and/or energy is not within the execution time and/or energy range established for the program, then the energy/execution time optimization controller 1102 may invoke the code generator parameter adjustment 1104, program parameter adjustment 1106, and/or voltage adjustment 1108 to generate a new version of the program that provides an execution time and/or energy that is within the established execution time and/or energy range. The execution timing range may specify a range of preferred execution times. The energy use range may specify, for example, a maximum instantaneous power and/or a total cumulative preferred range of energy used.

The code generator parameter adjustment 1104 identifies parameters of the code generator 1114 that affect the execution time of the program and/or the energy use associated with program execution. The code generator parameter adjustment 1104 changes the value of an identified code generation parameter to adjust the execution time and/or energy use associated with execution of the program as needed to produce an execution time and/or energy use that is within the established time and energy ranges. The identified code generation parameter may include a compiler optimization setting.

The program parameter adjustment 1106 identifies parameters of the program being developed that affect the execution time of the program and/or the energy use associated with program execution. The program parameter adjustment 1106 changes the value of an identified program parameter to adjust the execution time and/or energy use associated with execution of the program as needed to produce an execution time and/or energy use with the established time and energy ranges. The identified program parameter may change, for example, a frequency of a clock signal used by the processor, a computation accuracy applied by the processor, a power mode setting of the processor, a communication rate setting, an interrupt rate setting, etc.

The voltage adjustment 1108 changes the voltage level of power provided to the processor 1004 to adjust the energy use associated with execution of the program as needed to produce an energy use within the established time and energy ranges. The voltage selected by the voltage adjustment 1108 may be restricted to a predetermined range that is useable by the processor 1004 and meets other operating requirements of circuitry included on the processor 1004. For example, the voltage may be restricted to a range that provides adequate analog circuitry performance.

To produce a revised version of the program, the code generation control system 1100 triggers the code generator 1114. The load and execution controller 1112 transfers the revised program to the processor 1004 and initiates execution of the revised program. The execution time and energy use resulting from the execution is measured and evaluated.

Figure 12:
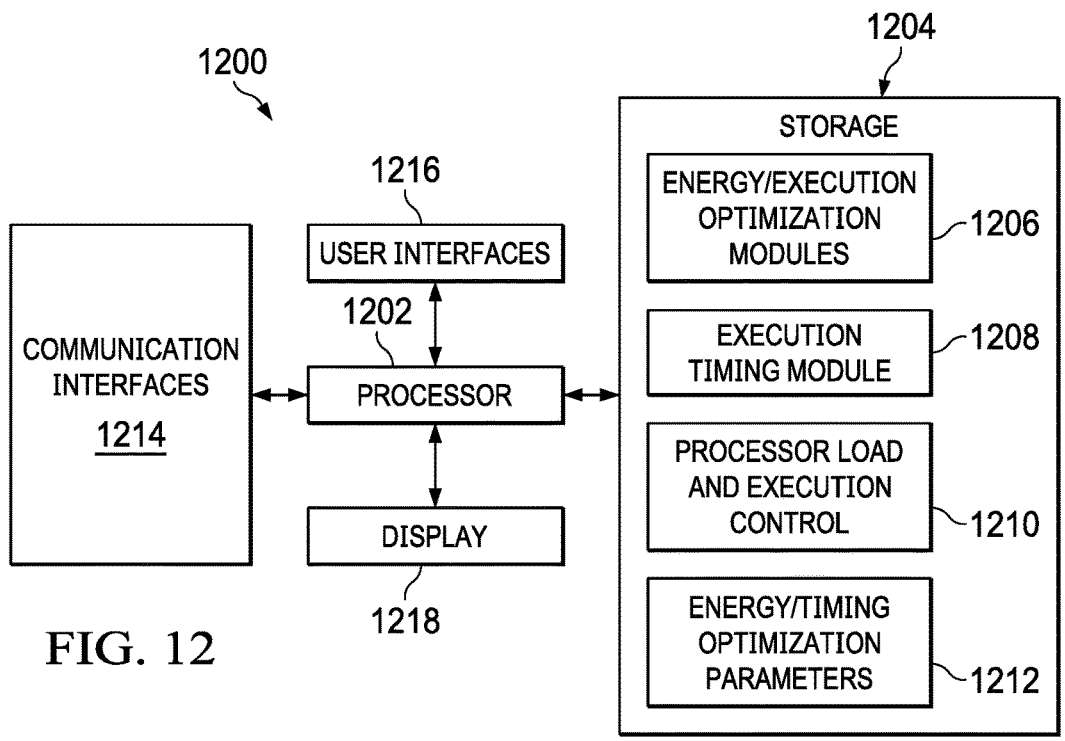
FIG. 12 shows a block diagram of a processor-based code generation control system for energy cognizant software development in accordance with principles disclosed herein.

FIG. 12 shows a block diagram of a processor-based code generation control system 1200 for energy cognizant software development in accordance with principles disclosed herein. The processor-based code generation control system 1200 performs the various functions described herein as performed by the code generation control system 1100 via execution of instructions by a processor. The code generation control system 1200 includes a processor 1202, storage 1204, communication interfaces 1214, user interfaces 1216, and display 1218. The code generation control system 1200 may be implemented via a computer device, such as a desktop computer, a notebook computer, a tablet computer, a smartphone, etc.

The processor 1202 may be a general-purpose microprocessor, digital signal processor, microcontroller, or other device capable of executing instructions retrieved from a computer-readable storage medium.

The storage 1204 is a non-transitory computer-readable storage medium suitable for storing instructions executable by the processor 1202. The storage 1204 may include volatile storage such as random access memory, non-volatile storage (e.g., a hard drive, an optical storage device (e.g., CD or DVD), FLASH storage, read-only-memory), or combinations thereof.

The storage 1204 includes instructions that are executed by the processor 1202 to perform the functions described herein with regard to the code generation control system 1100. For example, the storage 1204 may include energy/execution optimization modules 1206, an execution timing measurement module 1208, a processor load and execution control module 1210, and optimization parameters 1212. The energy/execution optimization modules 1206 include instructions for adjusting code generator parameters, program parameters, processor voltages, etc., for adjusting program execution time and/or execution energy to fall within user specified ranges. The execution timing measurement module 1208 measures program execution time. The processor load and execution control module 1210 downloads programs to the processor 1004, initiates, and controls execution of the downloaded program by the processor 1004. The parameters 1212 include the preferred energy and execution time ranges applicable to the program.

The display 1218 is coupled to the processor 1202. The processor 1202 provides data to the display 1218 for presentation. The display 1218 may include a liquid crystal display device, an organic light emitting diode display device, or any other display device suitable for display energy use information generated by the energy monitoring system.

The user interfaces 1216 are coupled to the processor 1202, and may include various devices and sub-systems that provide for user entry of information. The user interfaces 1216 may include a keyboard, a mouse, a trackball, or other user entry devices The communication interfaces 1214 communicatively couple the code generation control system 1200 to the energy tracking system 102 and the processor 1004.

Figure 13:
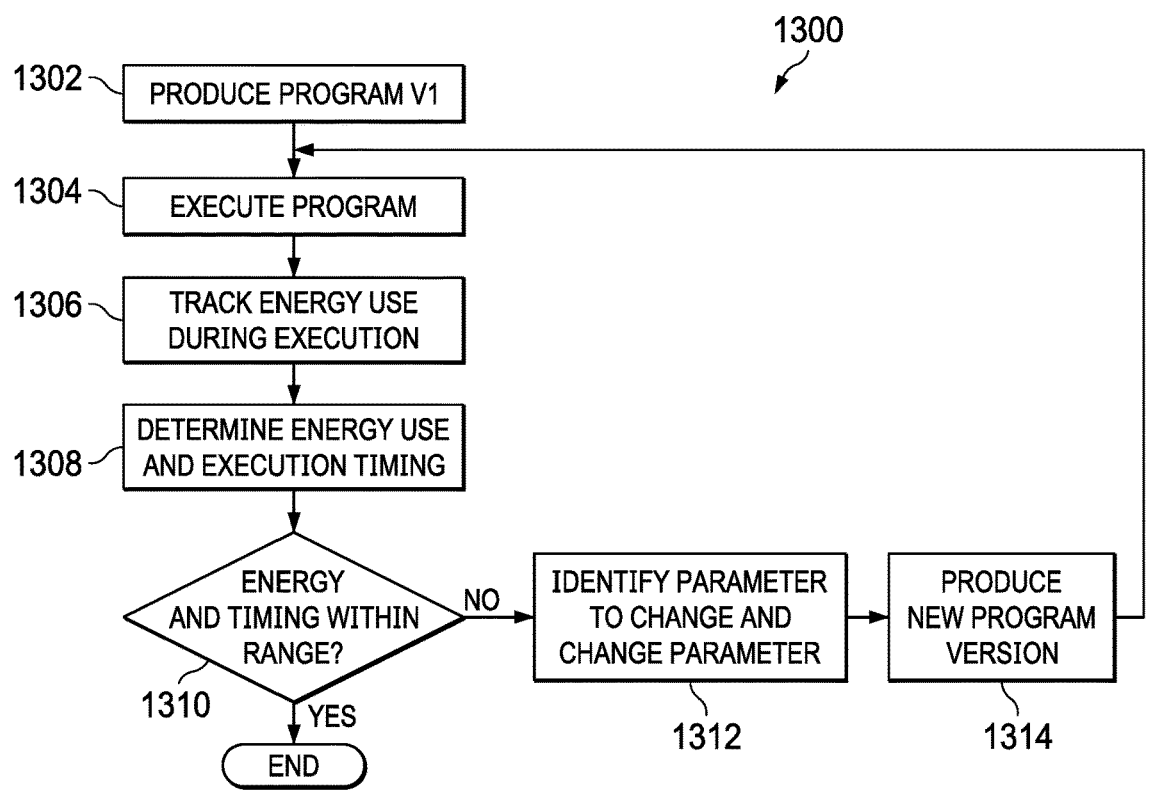
FIG. 13 shows a flow diagram for a method for energy cognizant software development in accordance with principles disclosed herein.

FIG. 13 shows a flow diagram for a method 1300 for energy cognizant software development in accordance with principles disclosed herein. Though depicted sequentially as a matter of convenience, at least some of the actions shown can be performed in a different order and/or performed in parallel. Additionally, some embodiments may perform only some of the actions shown. In some embodiments, at least some of the operations of the method 1300, as well as other operations described herein, can be implemented as instructions stored in a computer readable medium and executed by one or more processors.

In block 1302, the code generator 1114 generates a first version of a program. The load and execution controller 1112 downloads the first version of the program into the processor 1004.

In block 1304, the load and execution controller 1112 initiates execution of the program, and the processor 1004 executes the program.

In block 1306, the energy tracking system 102 measures the parameters of the pulses of the signal 112, voltages VIN and VOUT, etc. while the program is executing, and transfers the measured values to the energy monitoring system 106.

In block 1308, the energy monitoring system 108 processes the values and determines the energy used by the processor 1004 to execute the program. The energy monitoring system 108 transfers the energy values to the code generation control system 1100. The code generation control system 1100 also determines the time required to execute the program.

In block 1310, the code generation control system 1100 determines whether the energy used to execute the program and the measured execution time are within limits established for energy use and execution time.

If the energy used to execute the program and/or the measured execution time is outside the range established, then in block 1312, the code generation control system 1100 identifies a parameter of the program or the code generator 1114 that if changed may produce energy use and/or execution timing that is within the established range. The code generation control system 1100 changes the parameter.

In block 1314, code generation control system 1100 triggers the code generator 1114 to generate a second version of the program. The load and execution controller 1112 downloads the second version of the program into the processor 1004, and the second version of the program is executed in block 1304.

The method 1300 may iteratively generate different versions of the program and measure the execution time and energy use of the different versions until a version compliant with (or closest to compliance with) the established limits identified.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system comprising:
an energy tracking circuit configured to:
couple to a switching power supply to receive a switching signal, wherein:

the switching power supply has an output configured to provide power to a load;
a reference load is coupled to the output of the switching power supply;
a calibration load switch is coupled to the reference load to selectably provide a current path through the reference load;
the switching power supply includes an additional switch coupled between an energy source and the load; and
the switching signal is configured to control the additional switch;
measure a first value of a parameter of the switching signal associated with a time in which the calibration load switch provides the current path through the reference load; and
measure a second value of the parameter of the switching signal associated with a time in which the calibration load switch inhibits the current path through the reference load; and
an energy monitoring controller coupled to the energy tracking circuit and configured to:
receive the first value and the second value of the parameter; and
determine energy consumed by the load based on a difference between the first value and the second value.

2. The system of claim 1, wherein the energy monitoring controller is configured to couple to the load and to generate, based on the energy consumed by the load, a control signal to the load configured to cause the load to change loading of the switching power supply by the load.

3. The system of claim 2, wherein the control signal is configured to cause the load to change the loading by changing at least one of: a power mode of the load, timing of an interrupt event processed by the load, timing of loop execution in the load, a level of activity of the load, a load factor for the load, or leakage in the load.

4. The system of claim 2, wherein the control signal is configured to cause the load to change the loading by changing at least one of: accuracy of computations performed by the load, an amount of processing applied to data by the load, or a clock frequency of the load.

5. The system of claim 1, wherein:
the energy source comprises a battery; and
the energy monitoring controller is configured to estimate life of the battery coupled to the switching power supply.

6. The system of claim 1, wherein:
the switching power supply includes an energy storage circuit element;
the switching signal includes a set of pulses; and
the energy monitoring controller is configured to determine an amount of energy transferred to the energy storage circuit element by each pulse of the set of pulses.

7. The system of claim 1, wherein:
the switching signal includes a set of pulses; and
the parameter includes a pulse width of the set of pulses.

8. The system of claim 1, wherein:
the switching signal includes a set of pulses; and
the parameter includes an inter-pulse interval of the set of pulses.

9. The system of claim 1, wherein:
the switching signal includes a set of pulses; and
the energy tracking circuit includes error detection logic configured to:
determine whether a pulse width of the set of pulses exceeds a pulse-width threshold; and determine whether an inter-pulse interval of the set of pulses exceeds an inter-pulse interval threshold.

10. The system of claim 1, wherein the energy tracking circuit includes error detection logic configured to:
receive a VIN value and a VOUT value associated with the switching power supply;
determine whether the VIN value exceeds a VIN threshold; and
determine whether the VOUT value exceeds a VOUT threshold.

11. The system of claim 1, wherein:
the switching signal includes a set of pulses; and
the set of pulses are fixed-length pulses.

12. The system of claim 1, wherein:
the switching signal includes a set of pulses; and
the set of pulses are variable duration pulses.

13. A system comprising:
a switching power supply that includes:
an input to receive an input voltage;
an output configured to couple to a load to provide an output voltage to the load based on the input voltage and to couple to a reference load, wherein a calibration load switch is coupled to the reference load to control a current path through the reference load;
a first switch coupled to control the providing of the output voltage based on the input voltage according to a switching signal; and
a controller coupled to the first switch to provide the switching signal;
an energy tracking circuit coupled to the switching power supply and configured to:
receive the switching signal;
measure a first value of a parameter of the switching signal associated with a time in which the calibration load switch provides the current path through the reference load; and
measure a second value of the parameter of the switching signal associated with a time in which the calibration load switch inhibits the current path through the reference load; and
an energy monitoring controller coupled to the energy tracking circuit and configured to:
receive the first value and the second value of the parameter; and
determine energy consumed by the load based on a difference between the first value and the second value.

14. The system of claim 13, wherein the energy monitoring controller is configured to couple to the load and to generate, based on the energy consumed by the load, a control signal to the load configured to cause the load to change loading of the switching power supply by the load.

15. The system of claim 14, wherein the control signal is configured to cause the load to change the loading by changing at least one of: a power mode of the load, timing of an interrupt event processed by the load, timing of loop execution in the load, a level of activity of the load, a load factor for the load, or leakage in the load.

16. The system of claim 14, wherein the control signal is configured to cause the load to change the loading by changing at least one of: accuracy of computations performed by the load, an amount of processing applied to data by the load, or a clock frequency of the load.

17. The system of claim 13, wherein the first value and the second value each include a time stamp corresponding to a start of a respective pulse of the switching signal and at least one of: a time stamp corresponding to an end of the respective pulse or a duration of the respective pulse.

18. The system of claim 13, wherein:
the switching power supply includes an energy storage circuit element coupled to provide the output voltage based on the input voltage;
the switching signal includes a set of pulses; and
the energy monitoring controller is configured to determine an amount of energy transferred to the energy storage circuit element by each pulse of the set of pulses.

19. The system of claim 13, wherein the energy monitoring controller is configured to estimate life of a battery coupled to the switching power supply.

20. The system of claim 13, wherein the load includes a processor.

* * * * *